(12) United States Patent
Yoon et al.

(10) Patent No.: US 10,643,935 B2
(45) Date of Patent: May 5, 2020

(54) SEMICONDUCTOR DEVICE

(71) Applicant: Samsung Electronics Co., Ltd., Suwon-si, Gyeonggi-do (KR)

(72) Inventors: Sung Young Yoon, Gongju-si (KR); Yong Sang Cho, Hwaseong-si (KR); Sang Su Ha, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/126,430

(22) Filed: Sep. 10, 2018

(65) Prior Publication Data

US 2019/0244884 A1 Aug. 8, 2019

(30) Foreign Application Priority Data

Feb. 2, 2018 (KR) .......................... 10-2018-0013504

(51) Int. Cl.
| | |
|---|---|
| *H01L 23/52* | (2006.01) |
| *H01L 23/498* | (2006.01) |
| *H01L 23/532* | (2006.01) |
| *H01L 23/00* | (2006.01) |
| *H01L 27/06* | (2006.01) |

(52) U.S. Cl.
CPC .. *H01L 23/49816* (2013.01); *H01L 23/53295* (2013.01); *H01L 24/06* (2013.01); *H01L 24/14* (2013.01); *H01L 27/0688* (2013.01); *H01L 24/05* (2013.01); *H01L 24/13* (2013.01); *H01L 2224/02377* (2013.01); *H01L 2224/0401* (2013.01); *H01L 2224/05008* (2013.01); *H01L 2224/05009* (2013.01); *H01L 2224/0603* (2013.01); *H01L 2224/1411* (2013.01); *H01L 2224/14131* (2013.01); *H01L 2224/14505* (2013.01); *H01L 2924/01029* (2013.01); (Continued)

(58) Field of Classification Search
CPC ..... H01L 2924/014; H01L 2224/73204; H01L 2224/32145; H01L 2924/01029; H01L 2924/01047; H01L 2224/05647; H01L 23/49816; H01L 24/13; H01L 24/16; H01L 24/81; H01L 23/49838; H01L 23/3114; H01L 23/5384; H01L 23/5226; H01L 23/5386; H01L 23/5329; H01L 23/53295
USPC ........................................................ 257/738
See application file for complete search history.

(56) References Cited

U.S. PATENT DOCUMENTS

| | | |
|---|---|---|
| 7,282,444 B2 | 10/2007 | Tanida et al. |
| 7,795,743 B2 | 9/2010 | Kim et al. |

(Continued)

FOREIGN PATENT DOCUMENTS

| | | |
|---|---|---|
| JP | 2005-167093 A | 6/2005 |
| JP | 2013-211508 A | 10/2013 |

*Primary Examiner* — Theresa T Doan
(74) *Attorney, Agent, or Firm* — Lee IP Law, PC

(57) ABSTRACT

A semiconductor device includes a semiconductor chip including a gate structure, the semiconductor chip having a first region and a second region that surrounds sides of the first region, first solder balls on the first region of the semiconductor chip and containing a first weight percent of silver, second solder balls on the first region of the semiconductor chip and containing a second weight percent of silver greater than the first weight percent, and third solder balls on the second region of the semiconductor chip and containing a third weight percent of silver less than the first weight percent.

20 Claims, 5 Drawing Sheets

(52) U.S. Cl.
CPC .................. *H01L 2924/01047* (2013.01); *H01L 2924/14* (2013.01); *H01L 2924/15311* (2013.01)

(56) References Cited

U.S. PATENT DOCUMENTS

| | | |
|---|---|---|
| 8,525,333 B2 | 9/2013 | Kenetaka |
| 9,207,275 B2 | 12/2015 | Bartley et al. |
| 9,553,065 B2 | 1/2017 | Lin et al. |
| 9,721,912 B2 | 8/2017 | Khandekar et al. |
| 2007/0023910 A1 | 2/2007 | Beddingfield |
| 2007/0096338 A1 | 5/2007 | Kim et al. |
| 2014/0252603 A1* | 9/2014 | Lee .............. H01L 23/481 257/737 |
| 2016/0218090 A1* | 7/2016 | Yu .............. H01L 23/3114 |

* cited by examiner

US 10,643,935 B2

SEMICONDUCTOR DEVICE

CROSS-REFERENCE TO RELATED APPLICATION

Korean Patent Application No. 10-2018-0013504, filed on Feb. 2, 2018, in the Korean Intellectual Property Office, and entitled: "SEMICONDUCTOR DEVICE," is incorporated by reference herein in its entirety.

BACKGROUND

1. Field

Embodiments relate to a semiconductor device.

2. Description of the Related Art

Wafer level packaging (WLP) (or wafer fabricated packaging (WFP)) is a process that may include fabricating integrated circuits (ICs) in a wafer state (pre-processing), performing packaging and electrical testing (post-processing), and then dividing the ICs into individual packages. WLP is different from a packaging method in which ICs in a wafer state are divided into individual chips first and then the individual chips are packaged.

SUMMARY

Embodiments are directed to a semiconductor device, including a semiconductor chip including a gate structure, the semiconductor chip having a first region and a second region that surrounds sides of the first region, first solder balls on the first region of the semiconductor chip and containing a first weight percent of silver, second solder balls on the first region of the semiconductor chip and containing a second weight percent of silver greater than the first weight percent, and third solder balls on the second region of the semiconductor chip and containing a third weight percent of silver less than the first weight percent.

Embodiments are also directed to a semiconductor device, including a semiconductor chip including a gate structure, the semiconductor chip having a first region and a second region that surrounds sides of the first region, a redistribution layer on the first region of the semiconductor chip, first solder balls on the first region of the semiconductor chip, electrically insulated from the redistribution layer, and having a first degree of thermal expansion, second solder balls on the first region of the semiconductor chip, electrically connected to the redistribution layer, and having a second degree of thermal expansion greater than the first degree of thermal expansion, and third solder balls on the second region of the semiconductor chip, electrically insulated from the redistribution layer, and having a third degree of thermal expansion less than the first degree of thermal expansion.

Embodiments are also directed to a semiconductor device, including a semiconductor chip including a gate structure, the semiconductor chip having a first region and a second region that surrounds sides of the first region, a redistribution layer on the first region of the semiconductor chip, first solder balls on the first region of the semiconductor chip, electrically insulated from the redistribution layer, and having a first hardness, second solder balls on the first region of the semiconductor chip, electrically connected to the redistribution layer, and having a second hardness greater than the first hardness, and third solder balls on the second region of the semiconductor chip, electrically insulated from the redistribution layer, and having a third hardness less than the first hardness.

BRIEF DESCRIPTION OF THE DRAWINGS

Features will become apparent to those of skill in the art by describing in detail example embodiments with reference to the attached drawings in which.

DETAILED DESCRIPTION

Embodiments will become apparent to one of skill in the art by referencing the figures and the detailed description given below. Example embodiments are not restricted to those set forth herein.

A semiconductor device according to an example embodiment will hereinafter be described with reference to FIG. 1 through FIG. 3.

Figure 1:
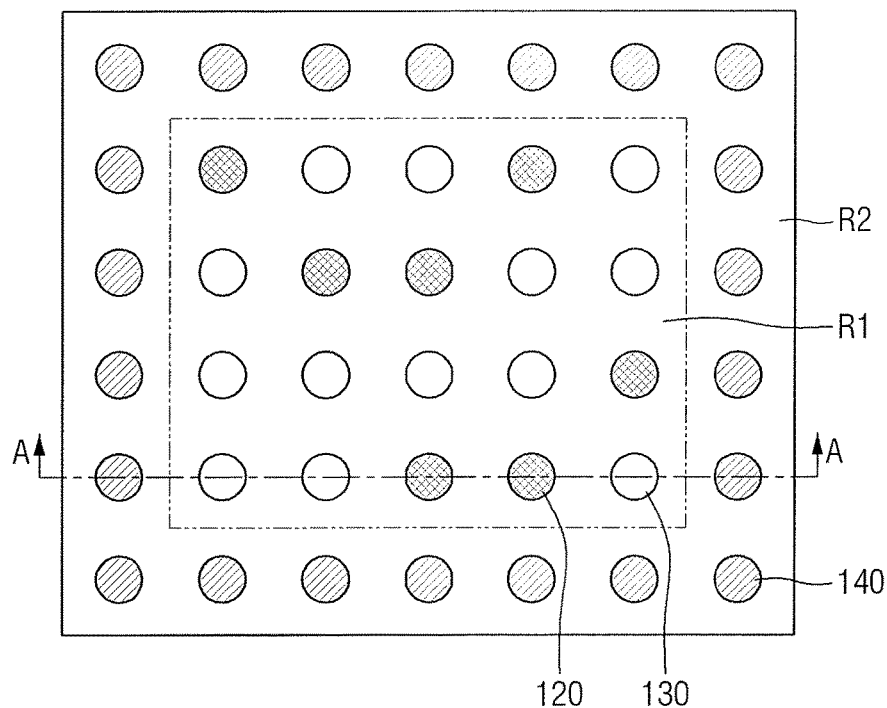
FIG. 1 illustrates a plan view illustrating the arrangement of solder balls of a semiconductor device according to an example embodiment.

FIG. 1 illustrates a plan view of an arrangement of solder balls of a semiconductor device according to an example embodiment. FIG. 2 illustrates a cross-sectional view taken along line A-A of FIG. 1. FIG. 3 illustrates an enlarged cross-sectional view of a part B of FIG. 2.

Figure 2:
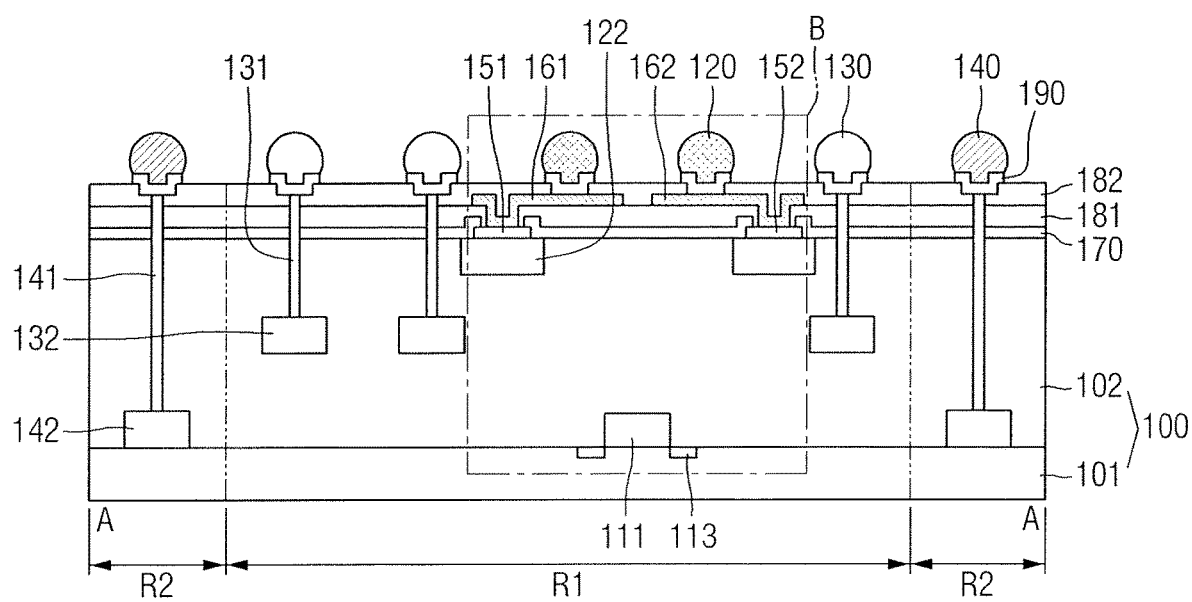
FIG. 2 illustrates a cross-sectional view taken along line A-A of FIG. 1.
Figure 3:
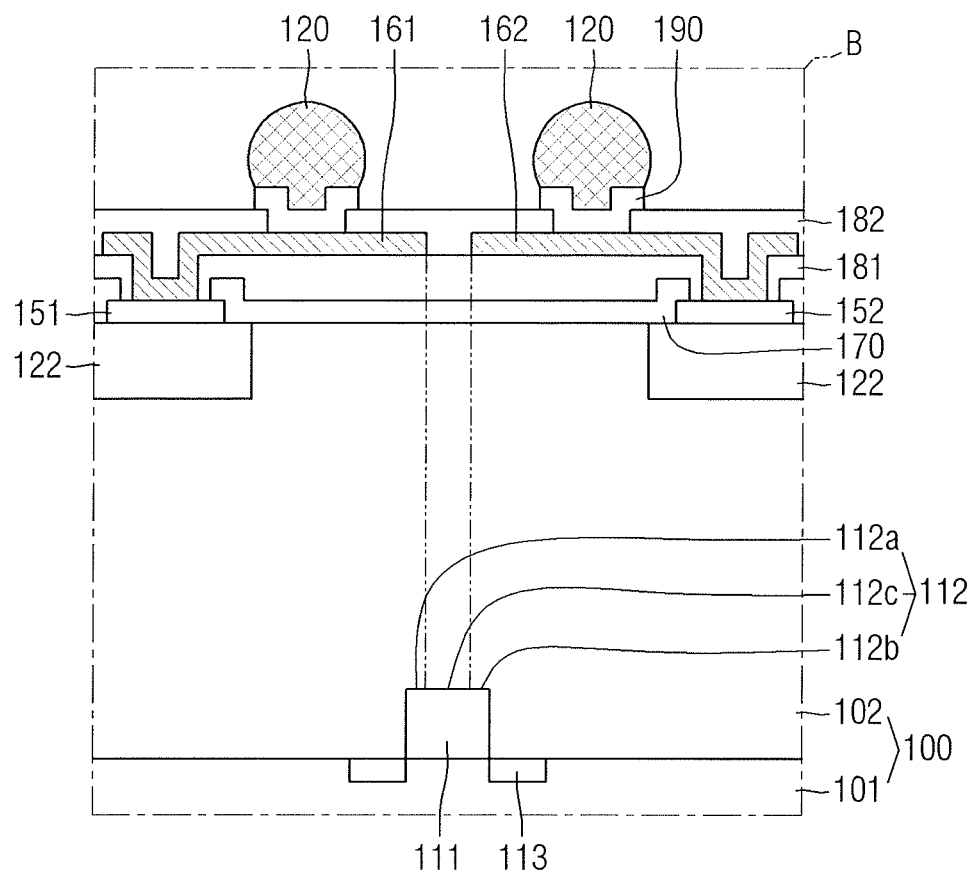
FIG. 3 illustrates an enlarged cross-sectional view of a part B of FIG. 2.

Referring to FIG. 1 through FIG. 3, a semiconductor device according to an example embodiment may include a semiconductor chip 100, first solder balls 130, second solder balls 120, third solder balls 140, a first electrode pad 151, a second electrode pad 152, a first redistribution layer 161, a second redistribution layer 162, a passivation layer 170, a first insulating layer 181, a second insulating layer 182, and an under bump metallurgy (UBM) layer 190.

The semiconductor chip 100 has an integrated circuit (IC). The semiconductor chip 100 may include a lower semiconductor layer 101 and an upper semiconductor layer 102, the upper semiconductor layer 102 being stacked on the lower semiconductor layer 101 along a stacking direction.

The lower semiconductor layer 101 may correspond to a substrate for forming a transistor. For example, the lower semiconductor layer 101 may include an active region for forming a transistor. The active region may include source/drain regions 113.

The upper semiconductor layer 102 may be a circuit forming region that extends from a transistor formed on the lower semiconductor layer 101 (e.g., a substrate). The type of the IC may vary depending on the type of the semiconductor chip 100. For example, the IC may be a memory circuit, a logic circuit, or a combination thereof. The IC may also be a passive element including a resistor or a capacitor.

The upper semiconductor layer 102 may include a gate structure 111 for forming a transistor, and may further include various elements such as wires, contacts, vias, insulating layers, or the like that electrically connect a variety of semiconductor elements used to implement a circuit.

For example, the upper semiconductor layer 102 may include second through vias 131, third through vias 141, first metal wiring layers 122, second metal wiring layers 132, and third metal wiring layers 142, which are all for forming electrical connections between circuit elements.

The arrangement of the through vias and the metal wiring layers illustrated in FIG. 2 is merely an example, and the numbers of, and the arrangement of, through vias and metal wiring layers may vary. FIG. 2 illustrates the upper semiconductor layer 102 as including a single gate structure 111. In another implementation, the upper semiconductor layer 102 may include two or more gate structures, etc.

The semiconductor chip 100 may include a first region R1 a second region R2, in which the second region R2 surrounds the sides of the first region R1.

The second solder balls 120 may provide good performance in drop testing, which is hardness testing. The second solder balls 120 may be on the first region R1 of the semiconductor chip 100. The third solder balls 140 may provide good performance in thermal cycling testing, which is thermal expansion testing. The third solder balls 140 may be on the second region R2 of the semiconductor chip 100.

The first and second electrode pads 151 and 152 may be on the top surface of the semiconductor chip 100 to be electrically connected to metal wiring layers in the semiconductor chip 100.

For example, the first electrode pad 151 may be on the top surface of the upper semiconductor layer 102 and may electrically connect the first redistribution layer 161 and a first metal wiring layer 122 disposed below the first redistribution layer 161. The second electrode pad 152 may be on the top surface of the upper semiconductor layer 102 and may electrically connect the second redistribution layer 162 and a first metal wiring layer 122 disposed below the second redistribution layer 162. The first and second electrode pads 151 and 152 may include, e.g., aluminum (Al).

The passivation layer 170 may cover the entire top surface of the semiconductor chip except for the first and second electrode pads 151 and 152. The passivation layer 170 may cover the sides and the edges of each of the first and second electrode pads 151 and 152. The passivation layer 170 may include, e.g., a nitride or an oxide.

The first insulating layer 181 may be on the passivation layer 170. The first insulating layer 181 may electrically insulate the first and second redistribution layers 161, which electrically connect the first and second electrode pads 151 and 152 to the second solder balls 120, from other elements.

The first insulating layer 181 may be formed of a polymer material such as photosensitive polyimide (PSPI), benzocyclobutene (BCB), or epoxy. For example, a PSPI layer may be deposited on the first and second electrode pads 151 and 152, and may be partially removed to expose the first and second electrode pads 151 and 152.

The first insulating layer 181 may cover the sides and the edges of each of the first and second electrode pads 151 and 152.

The first and second redistribution layers 161 and 162 may be on the first electrode pad 151, the second electrode pad 152, and the first insulating layer 181. The first and second redistribution layers 161 and 162 may be spaced apart from each other. In another implementation, the first and second redistribution layers 161 and 162 may be connected together to form a single redistribution layer.

The first redistribution layer 161 may electrically connect the first electrode pad 151 and a second solder ball 120 on the first electrode pad 151. The second redistribution layer 162 may electrically connect the second electrode pad 152 and a second solder ball 120 on the second electrode pad 152.

The first and second redistribution layers 161 and 162 may be electrically insulated from the first solder balls 130 and the third solder balls 140.

The first and second redistribution layers 161 and 162 may be formed by, e.g., a damascene process.

The first and second redistribution layers 161 and 162 may function as interconnections for forming electrical connections. Thus, the first and second redistribution layers 161 and 162 may be formed of a material having high electric conductivity. For example, the first and second redistribution layers 161 and 162 may include titanium (Ti), copper (Cu), or nickel (Ni).

The first and second redistribution layers 161 and 162 may be formed as thin films by, e.g., depositing several metals in order to secure excellent electric conductivity, adhesion, and protection.

As illustrated in FIG. 3, each of the first and second redistribution layers 161 and 162 may overlap, e.g., may partially overlap, a top surface 112 of the gate structure 111 along the stacking direction.

For example, a part of the first redistribution layer 161 may overlap a first part 112a of the top surface 112 of the gate structure 111 along the stacking direction, and a part of the second redistribution layer 162 may overlap a second part 112b of the top surface 112 of the gate structure 111 along the stacking direction.

A third part 112c of the top surface 112 of the gate structure 111, formed between the first and second parts 112a and 112b of the top surface 112 of the gate structure 111, may not overlap the first and second redistribution layers 161 and 162 along the stacking direction, for example.

The second insulating layer 182 may be on the first redistribution layer 161, the second redistribution layer 162, and the first insulating layer 181. The second insulating layer 182 may insulate the first and second redistribution layers 161 and 162 from other elements and may protect the first and second redistribution layers 161 and 162.

The second insulating layer 182, like the first insulating layer 181, may be formed of various polymer materials. The second insulating layer 182, unlike the first insulating layer 181, may not be removed from regions where the second insulating layer 182 overlaps the first and second electrode pads 151 and 152 along the stacking direction, but may be removed from regions where the UBM layer 190 is formed.

The UBM layer 190 may be between the second solder balls 120 and parts of the first and second redistribution layers exposed by the second insulating layer 182. The UBM layer 190 may electrically connect the first and second redistribution layers 161 and 162 and the second solder balls 120.

The UBM layer 190 may be between the second insulating layer 182 and the first solder balls 130. The UBM layer 190 may electrically connect the first solder balls 130 and the second metal wiring layers 132 in the upper semiconductor layer 102, via the second through vias 131. The second through vias 131 may sequentially penetrate the second insulating layer 182, the first insulating layer 181, and the passivation layer 170, and then penetrate the upper semiconductor layer 102 partially. along the stacking direction.

The UBM layer 190 may be between the second insulating layer 182 and the third solder balls 140. The UBM layer 190 may electrically connect the third solder balls 140 and the third metal wiring layers 142 in the upper semiconductor layer 102, via the third through vias 141. The third through vias 141 may sequentially penetrate the second insulating layer 182, the first insulating layer 181, and the passivation layer 170, and then penetrate the upper semiconductor layer 102 partially, along the stacking direction.

The first solder balls 130 may be on the first region R1 of the semiconductor chip 100. For example, the first solder balls 130 may be on the top surface of the upper semiconductor layer 102 where the passivation layer 170 is disposed. The first solder balls 130 may be electrically insulated from the first and second redistribution layers 161 and 162.

As illustrated in FIG. 1 and FIG. 2, the second solder balls 120 may be on the first region R1 of the semiconductor chip 100, and the first solder balls 130 may be on the entire first region R1 of the semiconductor chip 100 except for regions where the second solder balls 120 are formed. In an implementation, the third solder balls 140 may not be disposed in the first region R1.

The first solder balls 130 may include silver (Ag), tin (Sn), and copper (Cu). For example, the first solder balls 130 may include a first weight percent of silver (Ag), a fourth weight percent of tin (Sn), and a seventh weight percent of copper (Cu).

The second solder balls 120 may be on the first region RI of the semiconductor chip 100. For example, the second solder balls 120 may be on the top surface of the upper semiconductor layer 102 where the passivation layer 170 is disposed. The second solder balls 120 may be electrically connected to the first and second redistribution layers 161 and 162.

As illustrated in FIG. 1 and FIG. 2, the second solder balls 120 may be on the first region R1 of the semiconductor chip 100 to overlap the first and second redistribution layers 161 and 162 along the stacking direction.

The second solder balls 120 may include silver (Ag), tin (Sn), and copper (Cu). For example, the second solder balls 120 may include a second weight percent of silver (Ag), a fifth weight percent of tin (Sn), and an eighth weight percent of copper (Cu).

According to the present example embodiment, the second weight percent may be greater than the first weight percent, such that the second solder balls 120 may contain a greater amount of silver (Ag) than the first solder balls 130. The fifth weight percent may be less than the fourth weight percent, such that the second solder balls 120 may contain a smaller amount of tin (Sn) than the first solder balls 130. The eighth weight percent may be the same as the seventh weight percent, such that the second solder balls 120 may contain the same amount of copper (Cu) as the first solder balls 130.

In another implementation, the fifth weight percent may be the same as the fourth weight percent, and the eighth weight percent may be less than the seventh weight percent, such that the second solder balls 120 may contain the same amount of tin (Sn) as, and a smaller amount of copper (Cu) than, the first solder balls 130.

The third solder balls 140 may be on the second region R2 of the semiconductor chip 100. In an implementation, the second region R2 may have only the third solder balls 140, and none of the first solder balls 130 and none of the second solder balls 120. The third solder balls 140 may be on the top surface of the upper semiconductor layer 102 where the passivation layer 170 is disposed. The third solder balls 140 may be electrically insulated from the first and second redistribution layers 161 and 162.

As illustrated in FIG. 1 and FIG. 2, the third solder balls 140 may be on the second region R2, which surrounds the sides of the first region R1. The third solder balls 140 may be disposed along the edges of the top surface of the semiconductor chip 100.

The third solder balls 140 may include silver (Ag), tin (Sn), and copper (Cu). For example, the third solder balls 140 may include a third weight percent of silver (Ag), a sixth weight percent of tin (Sn), and a ninth weight percent of copper (Cu).

The third weight percent may be less than the first weight percent, such that the third solder balls 140 may contain a smaller amount of silver (Ag) than the first solder balls 130. The sixth weight percent may be greater than the fourth weight percent, such that the third solder balls 140 may contain a greater amount of tin (Sn) than the first solder balls 130. The ninth weight percent may be the same as the seventh weight percent, such that the third solder balls 140 may contain the same amount of copper (Cu) as the first solder balls 130.

In another implementation, the sixth weight percent may be the same as the fourth weight percent, and the ninth weight percent may be greater than the seventh weight percent, such that the third solder balls 140 may contain the same amount of tin (Sn) as, and a greater amount of copper (Cu) than, the first solder balls 130.

The first solder balls 130, the second solder balls 120, and the third solder balls 140 may have different compositions. Thus, the first solder balls 130, the second solder balls 120, and the third solder balls 140 may have different hardnesses and different degrees or amounts of thermal expansion.

For example, when the first solder balls 130 have a first hardness, the second solder balls 120 may have a second hardness, which is greater than the first hardness, and the third solder balls 140 may have a third hardness, which is less than the first hardness.

When the second solder balls 120, which are electrically connected to the first and second redistribution layers 161 and 162, are formed to have a greater hardness, the semiconductor device according to an example embodiment may exhibit excellent performance in drop testing, which is hardness testing.

When the first solder balls 130 have a first degree of thermal expansion, the second solder balls 120 may have a second degree of thermal expansion, which is greater than the first degree of thermal expansion, and the third solder balls 140 may have a third degree of thermal expansion, which is less than the first degree of thermal expansion.

When the third solder balls 140, which are on the second region R2 along the edges of the semiconductor chip 100, have a relatively low degree of thermal expansion, the semiconductor device according to an example embodiment may exhibit excellent performance in thermal cycling testing, which is thermal expansion testing.

As described above, the reliability of the semiconductor device according to an example embodiment can be improved in both drop testing and thermal cycling testing by forming the first solder balls 130, the second solder balls 120, and the third solder balls 140 to have different compositions.

Figure 4:
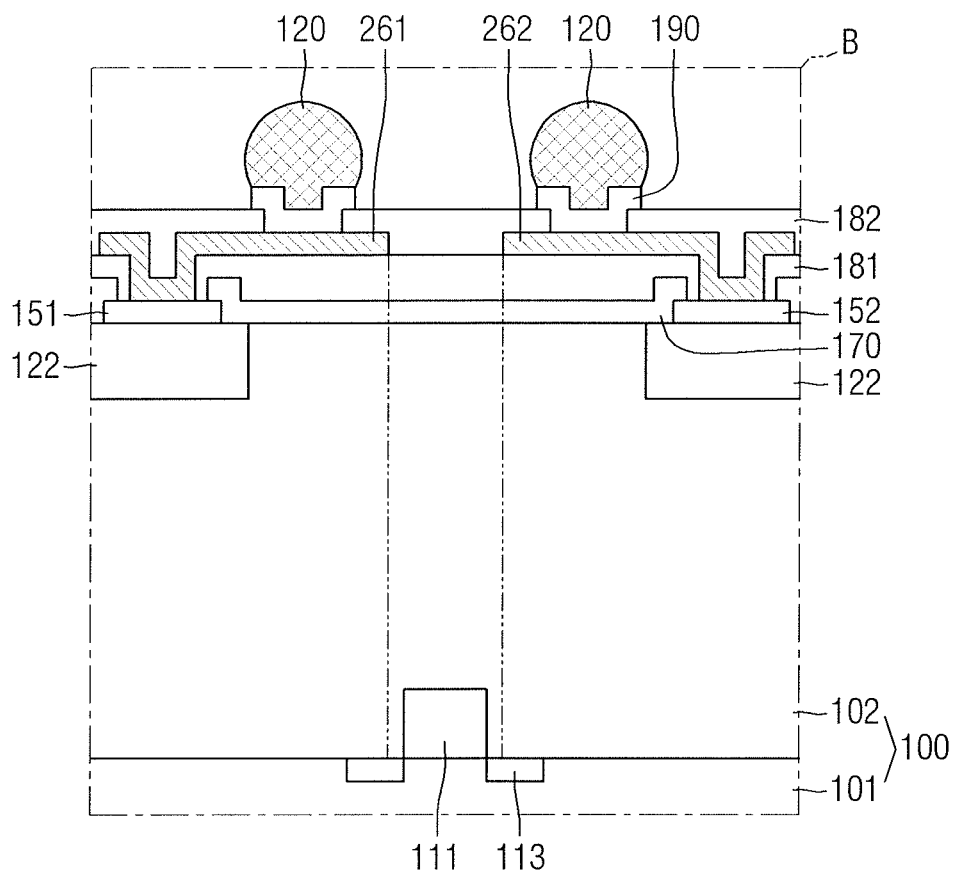
FIG. 4 illustrates a cross-sectional view of a semiconductor device according to an example embodiment.

A semiconductor device according to an example embodiment will hereinafter be described with reference to FIG. 4, focusing mainly on differences from the semiconductor device of FIG. 2 and FIG. 3. FIG. 4 illustrates a cross-sectional view of a semiconductor device according to an example embodiment.

In the example embodiment illustrated in FIG. 4, the gate structure 111 does not overlap first and second redistribution layers 261 and 262 along the stacking direction. The first and second redistribution layers 261 and 262 may be spaced further apart from each other, in a direction orthogonal to the stacking direction, than the first and second redistribution layers 161 and 162 of FIG. 2.

Figure 5:
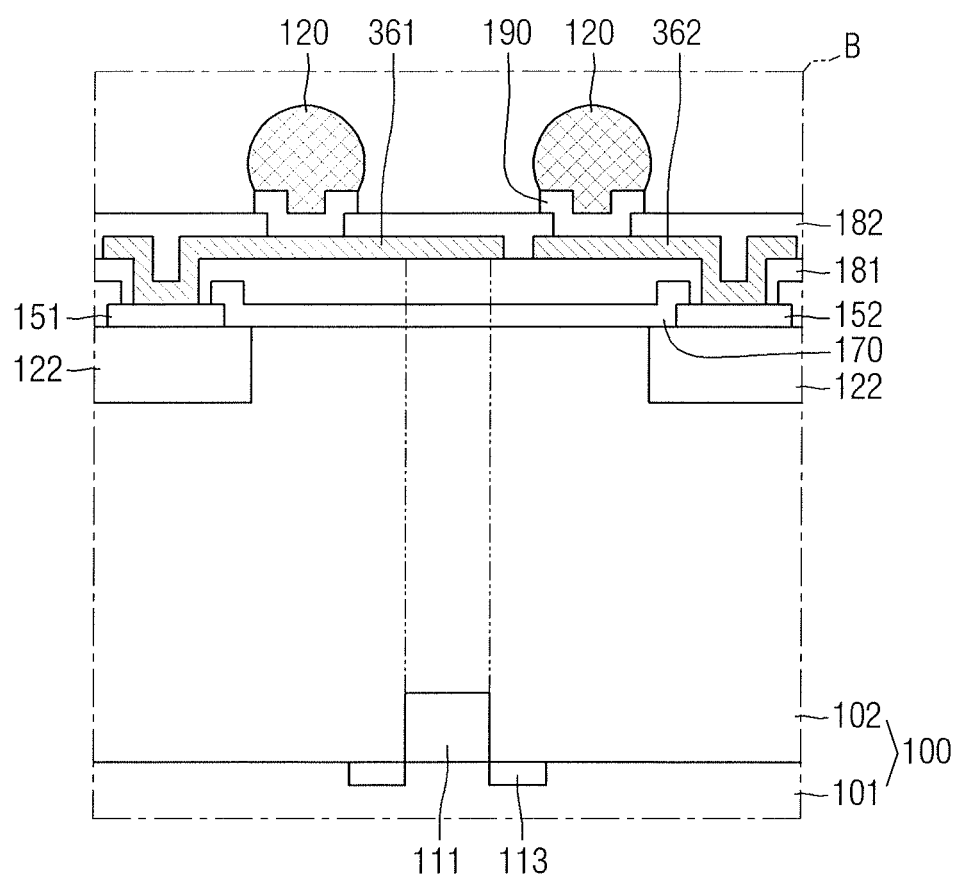
FIG. 5 illustrates a cross-sectional view of a semiconductor device according to an example embodiment.

A semiconductor device according to an example embodiment will hereinafter be described with reference to FIG. 5, focusing mainly on differences from the semiconductor device of FIG. 2 and FIG. 3. FIG. 5 illustrates a cross-sectional view of a semiconductor device according to an example embodiment.

In the example embodiment illustrated in FIG. 5, the gate structure 111 completely overlaps a first redistribution layer 361 along the stacking direction, while a second redistribution layer 362 does not overlap the gate structure 111 along the stacking direction. Thus, the gate structure 111 may overlap only one redistribution layer.

Figure 6:
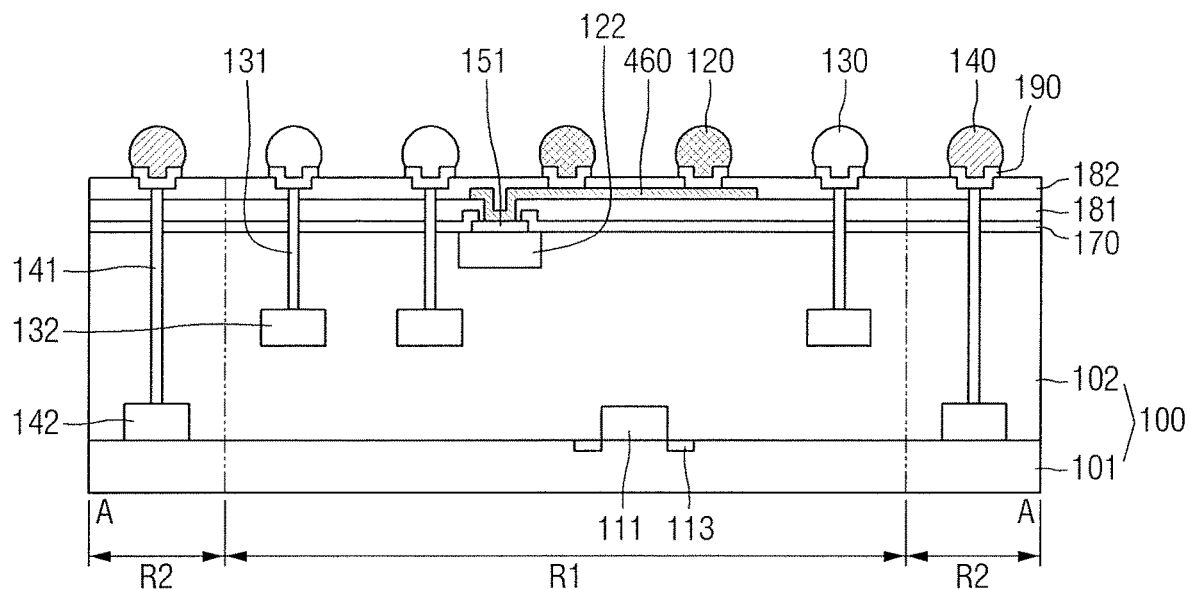
FIG. 6 illustrates a cross-sectional view of a semiconductor device according to an example embodiment.

A semiconductor device according to an example embodiment will hereinafter be described with reference to FIG. 1 and FIG. 6, focusing mainly on differences from the semiconductor device of FIG. 2. FIG. 6 illustrates a cross-sectional view of a semiconductor device according to an example embodiment.

Referring to FIG. 1 and FIG. 6, a plurality of the second solder balls 120 may be electrically connected to a redistribution layer 460.

The second solder balls 120 may all be electrically connected to the redistribution layer 460. In another implementation, only some of the second solder balls 120 may be electrically connected to the redistribution layer 460.

The gate structure 111 may completely overlap the redistribution layer 460 along the stacking direction. In another implementation, the redistribution layer 460 may overlap only a part of the gate structure 111 along the stacking direction.

Figure 7:
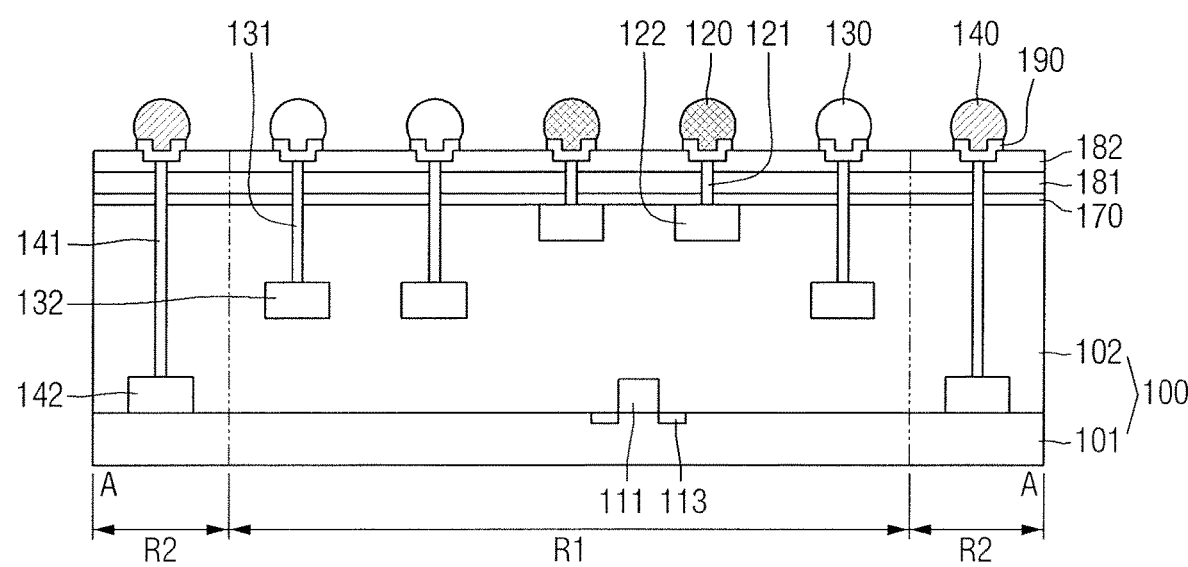
FIG. 7 illustrates a cross-sectional view of a semiconductor device according to an example embodiment.

A semiconductor device according to an example embodiment will hereinafter be described with reference to FIG. 1 and FIG. 7, focusing mainly on differences from the semiconductor device of FIG. 2. FIG. 7 illustrates a cross-sectional view of a semiconductor device according to an example embodiment.

Referring to FIG. 1 and FIG. 7, the second solder balls 120 may not be electrically connected to a redistribution layer.

All the second solder balls 120 may not be electrically connected to the redistribution layer. In another implementation, at least one of the second solder balls 120 may be electrically connected to the redistribution layer.

By way of summation and review, in WLP, a redistribution layer may be used to electrically connect electrode pads of a semiconductor chip to solder balls, which are external connection terminals of a package.

As described above, example embodiments may provide a semiconductor device that has three groups of solder balls having different compositions, and which may thus exhibit improved reliability in both drop testing and thermal cycling testing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a semiconductor chip including a gate structure, the semiconductor chip having a first region and a second region that surrounds sides of the first region;
   first solder balls on the first region of the semiconductor chip and containing a first weight percent of silver;
   second solder balls on the first region of the semiconductor chip and containing a second weight percent of silver greater than the first weight percent; and
   third solder balls on the second region of the semiconductor chip and containing a third weight percent of silver less than the first weight percent.

2. The semiconductor device as claimed in claim 1, further comprising a redistribution layer on the first region of the semiconductor chip, electrically connected to the second solder balls, and electrically insulated from the first solder balls and the third solder balls.

3. The semiconductor device as claimed in claim 2, wherein the redistribution layer includes a first redistribution layer electrically connected to one of the second solder balls, and a second redistribution layer electrically connected to another one of the second solder balls and is spaced apart from the first redistribution layer.

4. The semiconductor device as claimed in claim 3, wherein a top surface of the gate structure includes a first part that overlaps the first redistribution layer, a second part that overlaps the second redistribution layer, and a third part between the first and second parts that does not overlap the first and second redistribution layers.

5. The semiconductor device as claimed in claim 1, wherein:
   the first solder balls have a first degree of thermal expansion,
   the second solder balls have a second degree of thermal expansion greater than the first degree of thermal expansion, and
   the third solder balls have a third degree of expansion less than the first degree of thermal expansion.

6. The semiconductor device as claimed in claim 5, wherein:
   the first solder balls have a first hardness,
   the second solder balls have a second hardness greater than the first hardness, and
   the third solder balls have a third hardness less than the first hardness.

7. The semiconductor device as claimed in claim 1, wherein:
   the first solder balls contain a fourth weight percent of tin,
   the second solder balls contain a fifth weight percent of tin less than the fourth weight percent, and
   the third solder balls contain a sixth weight percent of tin greater than the fourth weight percent.

8. The semiconductor device as claimed in claim 7, wherein the first solder balls, the second solder balls, and the third solder balls all have a same copper content.

9. The semiconductor device as claimed in claim 1, wherein:

the first solder balls contain a seventh weight percent of copper, the second solder balls contain an eighth weight percent of copper less than the seventh weight percent, and the third solder balls contain a ninth weight percent of copper greater than the seventh weight percent.

10. The semiconductor device as claimed in claim 9, wherein the first solder balls, the second solder balls, and the third solder balls all have a same tin content.

11. A semiconductor device, comprising:

a semiconductor chip including a gate structure, the semiconductor chip having a first region and a second region that surrounds sides of the first region;

a redistribution layer on the first region of the semiconductor chip;

first solder balls on the first region of the semiconductor chip, electrically insulated from the redistribution layer, and having a first degree of thermal expansion;

second solder balls on the first region of the semiconductor chip, electrically connected to the redistribution layer, and having a second degree of thermal expansion greater than the first degree of thermal expansion; and third solder balls on the second region of the semiconductor chip, electrically insulated from the redistribution layer, and having a third degree of thermal expansion less than the first degree of thermal expansion.

12. The semiconductor device as claimed in claim 11, wherein:

the first solder balls have a first hardness, the second solder balls have a second hardness greater than the first hardness, and the third solder balls have a third hardness less than the first hardness.

13. The semiconductor device as claimed in claim 11, wherein:

the first solder balls contain a first weight percent of silver, the second solder balls contain a second weight percent of silver greater than the first weight percent, and the third solder balls contain a third weight percent of silver less than the first weight percent.

14. The semiconductor device as claimed in claim 11, wherein:

the first solder balls contain a fourth weight percent of tin, the second solder balls contain a fifth weight percent of tin less than the fourth weight percent, and the third solder balls contain a sixth weight percent of tin greater than the fourth weight percent.

15. The semiconductor device as claimed in claim 11, wherein:

the first solder balls contain a seventh weight percent of copper, the second solder balls contain an eighth weight percent of copper less than the seventh weight percent, and the third solder balls contain a ninth weight percent of copper greater than the seventh weight percent.

16. The semiconductor device as claimed in claim 11, wherein a top surface of the gate structure does not overlap the redistribution layer.

17. A semiconductor device, comprising:

a semiconductor chip including a gate structure, the semiconductor chip having a first region and a second region that surrounds sides of the first region;

a redistribution layer on the first region of the semiconductor chip;

first solder balls on the first region of the semiconductor chip, electrically insulated from the redistribution layer, and having a first hardness;

second solder balls on the first region of the semiconductor chip, electrically connected to the redistribution layer, and having a second hardness greater than the first hardness; and third solder balls on the second region of the semiconductor chip, electrically insulated from the redistribution layer, and having a third hardness less than the first hardness.

18. The semiconductor device as claimed in claim 17, wherein:

the first solder balls have a first degree of thermal expansion, the second solder balls have a second degree of thermal expansion greater than the first degree of thermal expansion, and the third solder balls have a third degree of expansion less than the first degree of thermal expansion.

19. The semiconductor device as claimed in claim 17, wherein:

the first solder balls contain a first weight percent of silver, the second solder balls contain a second weight percent of silver greater than the first weight percent, and the third solder balls contain a third weight percent of silver less than the first weight percent.

20. The semiconductor device as claimed in claim 17, wherein a top surface of the gate structure completely overlaps the redistribution layer.

* * * * *